US008378349B2

(12) United States Patent
Ko et al.

(10) Patent No.: US 8,378,349 B2
(45) Date of Patent: Feb. 19, 2013

(54) ORGANIC LIGHT EMITTING DISPLAY APPARATUS AND METHOD OF MANUFACTURING THE SAME

(75) Inventors: Moo-Soon Ko, Yongin (KR); Jae-Ho Yoo, Yongin (KR); Gyoo-Chul Jo, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 240 days.

(21) Appl. No.: 12/902,629

(22) Filed: Oct. 12, 2010

(65) Prior Publication Data

US 2011/0140138 A1 Jun. 16, 2011

(30) Foreign Application Priority Data

Dec. 10, 2009 (KR) ........................ 10-2009-0122532

(51) Int. Cl.
*H01L 21/00* (2006.01)
(52) U.S. Cl. ..... 257/59; 257/89; 257/369; 257/E21.409; 257/E21.598; 257/E27.062; 438/29; 438/89
(58) Field of Classification Search .............. 257/40, 257/59, 89, 238, 369, E21.409, 598, 27.062, 257/29.242; 438/29, 59, 299
See application file for complete search history.

(56) References Cited

U.S. PATENT DOCUMENTS

| 5,294,869 A * | 3/1994 | Tang et al. ............ 313/504 |
| 7,510,455 B2 | 3/2009 | Suzuki |
| 2005/0121669 A1 * | 6/2005 | Kobayashi ............ 257/40 |
| 2005/0140288 A1 | 6/2005 | Suzuki |
| 2005/0142976 A1 | 6/2005 | Suzuki |

(Continued)

FOREIGN PATENT DOCUMENTS

| JP | 2005-197009 | 7/2005 |
| JP | 2007-123067 | 5/2007 |

(Continued)

OTHER PUBLICATIONS

European Search Report issued by EPO, dated Mar. 30, 2011, corresponding to European Patent Application No. 10251888.3-1235.

(Continued)

*Primary Examiner* — Michael Lebentritt
(74) *Attorney, Agent, or Firm* — Robert E. Bushnell, Esq.

(57) ABSTRACT

An organic light emitting display apparatus and a method of manufacturing the same. The display apparatus includes first, second, and third sub-pixels formed on a substrate. The first sub-pixel includes a first pixel electrode, a first transmissive conductive layer formed on the first pixel electrode, a second transmissive conductive layer formed on the first transmissive conductive layer, a first organic light emitting layer formed on the second transmissive conductive layer, and a counter electrode formed on the first organic light emitting layer. The second sub-pixel includes a second pixel electrode, the first transmissive conductive layer formed on the second pixel electrode, a first protector covering an edge of the first transmissive conductive layer, a second organic light emitting layer electrically connected to the first transmissive conductive layer, and the counter electrode formed on the second organic light emitting layer. The third sub-pixel includes a third pixel electrode, a second protector covering an outer edge of the third pixel electrode, a third protector formed on the second protector, a third organic light emitting layer electrically connected to the third pixel electrode, and the counter electrode formed on the third organic light emitting layer.

29 Claims, 5 Drawing Sheets

U.S. PATENT DOCUMENTS

| | | | |
|---|---|---|---|
| 2007/0096632 A1* | 5/2007 | Chin et al. | 313/500 |
| 2009/0108264 A1* | 4/2009 | Inoue et al. | 257/59 |
| 2009/0200544 A1 | 8/2009 | Lee et al. | |
| 2011/0240970 A1* | 10/2011 | Park et al. | 257/40 |
| 2012/0013826 A1* | 1/2012 | Kubo et al. | 349/96 |
| 2012/0068271 A1* | 3/2012 | Tokunaga | 257/369 |
| 2012/0154732 A1* | 6/2012 | Morita | 349/143 |
| 2012/0176025 A1* | 7/2012 | Lee et al. | 313/503 |
| 2012/0229750 A1* | 9/2012 | Hatakeyama et al. | 349/153 |

FOREIGN PATENT DOCUMENTS

| | | |
|---|---|---|
| KR | 10-2005-0067055 | 6/2005 |
| KR | 1020050067055 A | 6/2005 |
| KR | 1020080003079 | 1/2008 |
| KR | 10-2008-0061675 | 7/2008 |
| KR | 1020090003590 A | 1/2009 |
| KR | 1020090036483 A | 4/2009 |

OTHER PUBLICATIONS

Korean Registration Determination Certificate issued by Korean Intellectual Property Office on Apr. 25, 2011, corresponding to Korean patent Application No. 10-2009-0122532 and Request for Entry of the Accompanying Office Action attached herewith.

* cited by examiner

ORGANIC LIGHT EMITTING DISPLAY APPARATUS AND METHOD OF MANUFACTURING THE SAME

CROSS-REFERENCE TO RELATED APPLICATION

This application claims the benefit of Korean Patent Application No. 10-2009-0122532, filed on Dec. 10, 2009, in the Korean Intellectual Property Office, the disclosure of which is incorporated herein by reference.

BACKGROUND

1. Field

An aspect of the present invention relates to an organic light emitting display apparatus and a method of manufacturing the same, and more particularly, to an organic light emitting display apparatus in which picture quality is easily improved and a method of manufacturing the same.

2. Description of the Related Art

Conventional display apparatuses are being replaced with portable thin film type flat panel display (FPD) apparatuses. Among FPD apparatuses, organic and inorganic light emitting display apparatuses are self-luminous display apparatuses which have a wide viewing angle, a high-quality contrast, and a fast response time. Thus, organic and inorganic display apparatuses have attracted attention as next generation display apparatuses. Also, an organic light emitting display apparatus including light emitting layers formed of an organic material has high-quality luminance, driving voltage, and response time, and a polychromatic characteristic in comparison with an inorganic light emitting display apparatus.

An organic light emitting display apparatus includes a cathode electrode, an anode electrode, and organic light emitting layers which are connected to the cathode and anode electrodes. When a voltage is applied to the cathode and anode electrodes, the organic light emitting layers emit visible rays.

An organic light emitting display apparatus includes organic light emitting layers which emit different colors of visible rays, i.e., red (R), green (G), and blue (B) visible rays, respectively. Light characteristics of R, G, and B visible rays emitted from organic light emitting layers, such as luminances, color coordinates, and the like, are not uniform. Therefore, improvement in picture quality of a manufactured organic light emitting display apparatus is limited.

SUMMARY

An aspect of the present invention provides an organic light emitting display apparatus in which picture quality is easily improved and a method of manufacturing the organic light emitting display apparatus.

According to an aspect of the present invention, there is provided an organic light emitting display apparatus including: first, second, and third sub-pixels which are formed on a substrate, wherein the first sub-pixel includes a pixel electrode, a first transmissive conductive layer formed on the pixel electrode, a second transmissive conductive layer formed on the first transmissive conductive layer, a first organic light emitting layer formed on the second transmissive conductive layer, and a counter electrode formed on the first organic light emitting layer; the second sub-pixel includes another pixel electrode, the first transmissive conductive layer formed on the pixel electrode, a first protector covering an edge of the first transmissive conductive layer, a second organic light emitting layer electrically connected to the first transmissive conductive layer, and the counter electrode formed on the second organic light emitting layer; and the third sub-pixel includes another pixel electrode, a second protector covering an outer edge of the pixel electrode, a third protector formed on the second protector, a third organic light emitting layer electrically connected to the pixel electrode, and the counter electrode formed on the third organic light emitting layer.

According to another aspect of the present invention, the pixel electrodes may include Indium-Tin Oxide (ITO).

The pixel electrodes may be formed in stack structures of ITO, silver (Ag), and ITO.

The first organic light emitting layer may emit red (R) visible rays, the second organic light emitting layer may emit green (G) visible rays, and the third organic light emitting layer may emit blue (B) visible rays.

The first and second transmissive conductive layers may include ITO.

The first transmissive conductive layer may extend to cover outer edges and sides of the pixel electrodes of the first and second sub-pixels.

The second transmissive conductive layer may extend to cover an area of the first transmissive conductive layer corresponding to an outer edge of the pixel electrode of the first sub-pixel.

The first protector may be formed of a same material as the second transmissive conductive layer.

The second protector may be formed of a same material as the first transmissive conductive layer.

The third protector may be formed of a same material as the second transmissive conductive layer.

The first protector may cover an area of the first transmissive conductive layer corresponding to the outer edge of the pixel electrode of the second sub-pixel.

The third protector may cover an area of the second protector corresponding to an outer edge of the pixel electrode of the third sub-pixel.

According to another aspect of the present invention, there is provided a method of manufacturing an organic light emitting display apparatus including first, second, and third sub-pixels formed on a substrate, including: forming pixel electrodes; forming a first organic light emitting layer in the first sub-pixel, a second organic light emitting layer in the second sub-pixel, and a third organic light emitting layer in the third sub-pixel, wherein the first, second, and third organic light emitting layers are electrically connected to the pixel electrodes; and forming a counter electrode on the first, second, and third organic light emitting layers, wherein the first sub-pixel includes a first transmissive conductive layer formed between the pixel electrode thereof and the first organic light emitting layer and a second transmissive conductive layer formed between the first transmissive conductive layer and the first organic light emitting layer; the second sub-pixel includes the first transmissive conductive layer formed between the pixel electrode thereof and the second organic light emitting layer and a first protector formed to cover an edge of the first transmissive conductive layer; and the third sub-pixel includes a second protector formed between the pixel electrode thereof and the third organic light emitting layer to cover an outer edge of the pixel electrode thereof and a third protector formed on the second protector.

According to another aspect of the present invention, the pixel electrodes may include ITO.

The pixel electrodes may be formed in stack structures of ITO, Ag, and ITO.

The first organic light emitting layer may emit R visible rays, the second organic light emitting layer may emit G visible rays, and the third organic light emitting layer may emit B visible rays.

The first and second transmissive conductive layers may include ITO.

The first transmissive conductive layers may extend to cover outer edges and sides of the pixel electrodes of first and second sub-pixels.

The second transmissive conductive layer may extend to cover an area of the first transmissive conductive layer corresponding to an outer edge of the pixel electrode of the first sub-pixel.

The first protector may be formed of a same material as the second transmissive conductive layer.

The second protector may be formed of a same material as the first transmissive conductive layer.

The third protector may be formed of a same material as the second transmissive conductive layer.

The first protector may cover an area of the first transmissive conductive layer corresponding to the outer edge of the pixel electrode of the second pixel.

The third protector may cover an area of the second protector corresponding to an outer edge of the pixel electrode of the third pixel.

First and second transmissive conductive materials may be sequentially formed on the pixel electrodes formed in the first, second, and third sub-pixels, and photolithography including a one-time exposure process is performed using a halftone mask in order to form the first and second transmissive conductive layers and the first, second, and third protectors, wherein the first transmissive conductive material forms the first transmissive conductive layer and the second protector, and the second transmissive conductive material forms the second transmissive conductive layer and the first and third protectors.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
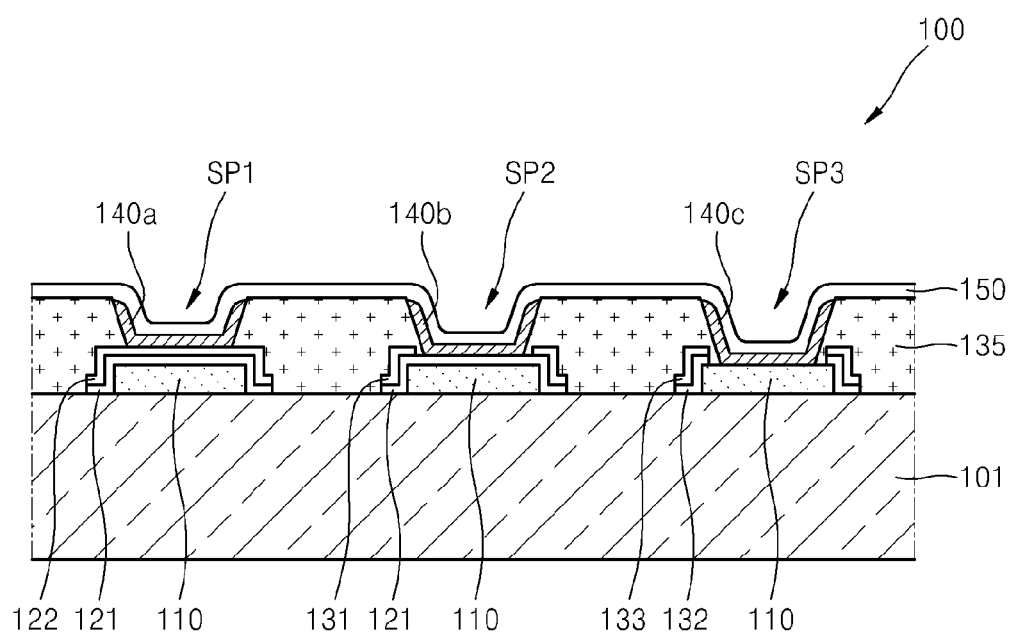
FIG. 1 is a schematic cross-sectional view of an organic light emitting display apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures. Moreover, it is to be understood that where is stated herein that one film or layer is "formed on" or "disposed on" a second layer or film, the first layer or film may be formed or disposed directly on the second layer or film or there may be intervening layers or films between the first layer or film and the second layer or film. Further, as used herein, the term "formed on" is used with the same meaning as "located on" or "disposed on" and is not meant to be limiting regarding any particular fabrication process.

FIG. 1 is a schematic cross-sectional view of an organic light emitting display apparatus 100 according to an embodiment of the present invention. Referring to FIG. 1, the organic light emitting display apparatus 100 includes a first sub-pixel SP1, a second sub-pixel SP2, and a third sub-pixel SP3. The first, second, and the third sub-pixels SP1, SP2, and SP3 are different color sub-pixels. For purposes of illustration, the first sub-pixel SP1 is referred to as a red (R) sub-pixel, the second sub-pixel SP2 is referred to as a green (G) sub-pixel, and the third sub-pixel SP3 is referred to as a blue (B) sub-pixel.

For convenience, one first sub-pixel SP1, one second sub-pixel SP2, and one third sub-pixel SP3 are shown in FIG. 1. However, the organic light emitting display apparatus 100 may include a plurality of first sub-pixels SP1, a plurality of second sub-pixels SP2, and a plurality of third sub-pixels SP3.

The first sub-pixel SP1 includes a pixel electrode 110, a first transmissive conductive layer 121, a second transmissive conductive layer 122, a first organic light emitting layer 140a, and a counter electrode 150. The second sub-pixel SP2 includes another pixel electrode 110, the first transmissive conductive layer 121, a first protector 131, a second organic light emitting layer 140b, and the counter electrode 150. The third sub-pixel SP3 includes another pixel electrode 110, a second protector 132, a third protector 133, a third organic light emitting layer 140c, and the counter electrode 150.

Structures of elements of the organic light emitting display apparatus 100 will now be described in more detail.

A substrate 101 may be formed of a transparent glass material including $SiO_2$ as a main component. The substrate 101 is not limited thereto and may be formed of a transparent plastic material. The transparent plastic material may be an organic material selected from the group consisting of polyethersulphone (PES), polyacrylate (PAR), polyetherimide (PEI), polyethyelenen napthalate (PEN), polyethyelene-terepthalate (PET), polyphenylene sulfide (PPS), polyallylate, polyimide, polycarbonate (PC), cellulose triacetate (TAC), and cellulose acetate propionate (CAP), which are insulating materials.

The substrate 101 may instead be formed of a metal. If the substrate 101 is formed of a metal, the substrate 101 may include one or more elements selected from the group consisting of carbon (C), iron (Fe), chrome (Cr), manganese (Mn), nickel (Ni), titanium (Ti), molybdenum (Mo), stainless steel (SUS), an invar alloy, an inconel alloy, and a kovar alloy, but is not limited thereto. The substrate 101 may be formed of a metal foil.

A buffer layer (not shown) is formed on the substrate 101 in order to form a smooth surface on the substrate 101 and to prevent impure elements from permeating into an upper part of the substrate 101. The buffer layer may be formed of $SiO_2$, $SiN_x$, or the like.

The pixel electrodes 110 are formed on the substrate 101. Before the pixel electrodes 110 are formed, thin film transistors (TFTs) (not shown) may be formed on the substrate 101. The organic light emitting display apparatus 100 may be used as an active matrix (AM) type organic light emitting display apparatus or as a passive matrix (PM) type organic light emitting display apparatus.

The pixel electrodes 110 may include Indium-Tin Oxide (ITO). The pixel electrodes 110 may be formed as stack structures of ITO, silver (Ag), and ITO (ITO/Ag/ITO). Visible rays emitted from the organic light emitting layers 140a, 140b, and 140c to the pixel electrodes 110 may be reflected toward the counter electrode 150 due to the presence of silver in the pixel electrodes 110.

The first and second transmissive conductive layers 121 and 122 are sequentially formed on the pixel electrode 110 in the first sub-pixel SP1.

The first transmissive conductive layer 121 is also formed on the pixel electrode 110 of the second sub-pixel SP2, and the first protector 131 is formed to cover an edge of the first transmissive conductive layer 121. In more detail, the first protector 131 covers an area of the first transmissive conductive layer 121 corresponding to an outer edge of the pixel electrode 110 of the second sub-pixel SP2.

The second protector 132 is formed to cover an outer edge of the pixel electrode 110 of the third sub-pixel SP3, and the third protector 133 is formed on the second protector 132. In more detail, the third protector 133 covers an area of the second protector 132 corresponding to the outer edge of the pixel electrode 110 of the third sub-pixel SP3.

The first and second transmissive conductive layers 121 and 122 may include ITO. The thicknesses of the first and second transmissive conductive layers 121 and 122 may vary according to processes performed thereon.

The first transmissive conductive layers 121 extend to cover an outer edge of the pixel electrode 110 of the first sub-pixel SP1 and the outer edge of the pixel electrode 110 of second sub-pixel SP2. The first transmissive conductive layer 121 also extends to cover sides of the pixel electrodes 110 of the first and second sub-pixels SP1 and SP2. Thus, the outer edges and sides of the pixel electrodes 110 of the first and second sub-pixels SP1 and SP2 are prevented from being damaged in subsequent processing.

The first protector 131 is formed of the same material as that of which the second transmissive conductive layer 122 is formed. In more detail, the first protector 131 may include ITO. The second protector 132 is formed of the same material as that of which the first transmissive conductive layer 121 is formed. In more detail, the second protector 132 may include ITO. The third protector 133 is formed of the same material as that of which the second transmissive conductive layer 122 is formed. In more detail, the third protector 133 may include ITO.

The first protector 131 protects the outer edge of the pixel electrode 110 of the second sub-pixel SP2. In other words, the first protector 131 is formed on the first transmissive conductive layer 121 to effectively prevent the pixel electrode 110 of the second sub-pixel SP2 from being damaged. The first protector 131 protects an outer edge of the first transmissive conductive layer 121 to prevent the first transmissive conductive layer 121 from being damaged.

The second protector 132 is formed to cover the outer edge of the pixel electrode 110 of the third sub-pixel SP3. In other words, the second protector 132 covers an upper surface and a side of the edge of the pixel electrode 110 of the third sub-pixel SP3. Thus, the protector 132 prevents the outer edge and side of the pixel electrode 110 of the third sub-pixel SP3 from being damaged in subsequent processing. The third protector 133 is stacked on the second protector 132 to increase the effect of protecting the pixel electrode 110 of the third sub-pixel SP3.

Therefore, durability of the pixel electrodes 110 is improved.

A pixel defining layer (PDL) 135 is formed on the pixel electrodes 110, the first and second transmissive conductive layers 121 and 122, and the first, second, and third protectors 131, 132, and 133.

The PDL 135 exposes predetermined areas of the second transmissive conductive layer 122 of the first sub-pixel SP1, the first transmissive conductive layer 121 of the second sub-pixel SP2, and the pixel electrode 110 of the third sub-pixel SP3. Therefore, the first, second, and third protectors 131, 132, and 133 are covered with the PDL 135 and thus are not exposed.

The PDL 135 is formed of an organic or inorganic material.

Organic light emitting layers are then formed. In more detail, the first organic light emitting layer 140a is formed in the first sub-pixel SP1 to emit R visible rays. The second organic light emitting layer 140b is formed in the second sub-pixel SP2 to emit G visible rays. The third organic light emitting layer 140c is formed in the third sub-pixel SP3 to emit B visible rays.

The first organic light emitting layer 140a may include an R light emitting material such as tetraphenylnaphthacene, rubrene, $Ir(piq)_3$, $Ir(btp)_2(acac)$, $Eu(dbm)_3(phen)$, $Ru(dtb-bpy)_3*2(PF_6)$, DCM1, DCM2, $Eu(TTA)_3$, butyl-6-(1,1,7,7-tetramethyljulolidyl-9-enyl)-4H-pyran (DCJTB), or a polymer light emitting material such as polyfluorene polymer, polyvinyl polymer, or the like.

The second organic light emitting layer 140b may include a G light emitting material such as Coumarin 6, C545T, DMQA, $Ir(ppy)_3$, or a polymer organic light emitting material such as polyfluorene polymer, polyvinyl polymer, or the like.

The third organic light emitting layer 140c may include a B light emitting material such as oxadiazole dimer dyes (Bis-DAPDXP), spiro compounds (Spiro-DPVBi, Spiro-6P), triarylamine compounds, bis(styryl)amine (DPVBi, DSA), BCzVBi, perylene, TPBe, BCzVB, DPAVBi, DPAVB, BDAVBi, FlrPic, or a polymer light emitting material such as polyfluorene polymer, polyvinyl polymer, or the like.

Although not shown in FIG. 1, before the organic light emitting layers are formed in the sub-pixels, a hole injection layer (HIL) or a hole transport layer (HTL) may be formed.

The counter electrode 150 is formed on the organic light emitting layers. The counter electrode 150 covers all the sub-pixels.

A metal having a low work function, e.g., Ag, Mg, Al, Pt, Pd, Au, Ni, Nd, Ir, Cr, Li, Ca, or a compound of Ag, Mg, Al, Pt, Pd, Au, Ni, Nd, Ir, Cr, Li, or Ca, is deposited, and a transparent conductive material such as ITO, IZO, ZnO, $In_2O_3$, or the like is deposited on the metal in order to form the counter electrode 150.

The pixel electrodes 110 can be anodes and the counter electrode 150 can be a cathode but this arrangement not limited thereto. Thus, the pixel electrodes 110 and the counter electrode 150 may have polarities thereof reversed.

Although not shown in FIG. 1, an electron transport layer (ETL) or an electron injection layer (EIL) may be formed between the organic light emitting layers and the counter electrode 150 for all/each of the sub-pixels throughout all the sub-pixels.

A sealing member (not shown) is disposed on the counter electrode 150 to face a surface of the substrate 101. The sealing member protects the organic light emitting layers and elements thereon from external moisture or oxygen and is formed of a transparent material. Therefore, the sealing member is formed of glass, plastic, or a stack structure of a plurality of organic and inorganic materials.

The organic light emitting display apparatus 100 has different first and second transmissive conductive layers 121 and 122 formed on the pixel electrodes 110 in the respective sub-pixels. In other words, the pixel electrode 110 of the first sub-pixel SP1 has stacked thereon the first transmissive conductive layer 121, and the second transmissive conductive layer 122 and may generate R visible rays. The pixel electrode 110 of the second sub-pixel SP2 has the first transmissive conductive layer 121, and the first protector 131 stacked thereon and may generate G visible rays. The pixel electrode 110 of the third sub-pixel SP3 is formed in the third sub-pixel SP3, and generates B visible rays.

Thus, optical path lengths of visible rays emitted from the organic light emitting layers to the pixel electrodes 110 are reflected by the pixel electrodes 110 and proceed to the counter electrode 150, and are differently determined for each of the sub-pixels. Thus, a microcavity effect is realized.

Here, the thicknesses of the first and second transmissive conductive layers 121 and 122 are adjusted to adjust the optical path lengths in each of the sub-pixels. Thus, color purity and optical efficiency of visible rays generated by the sub-pixels are improved. As a result, picture quality of the organic light emitting display apparatus 100 is improved.

The first transmissive conductive layer 121 extends to cover the outer edge and side of the pixel electrode 110 of the first sub-pixel SP1. The second transmissive conductive layer 122 is formed on an area of the first transmissive conductive layer 121 corresponding to the outer edge of the pixel electrode 110 of the first sub-pixel SP1 and prevents the pixel electrode 110 of the first sub-pixel SP1 from being damaged.

The first transmissive conductive layer 121 also extends to cover the outer edge of the pixel electrode 110 of the second sub-pixel SP2. The first protector 131 is formed on an area of the first transmissive conductive layer 121 corresponding to the outer edge of the pixel electrode 110 of the second sub-pixel SP2 and prevents the pixel electrode 110 of the second sub-pixel SP2 from being damaged.

The second protector 132 is formed on an area corresponding to the outer edge of the pixel electrode 110 of the third sub-pixel SP3. The third protector 133 is formed on the second protector 132 and prevents the pixel electrode 110 of the third sub-pixel SP3 from being damaged.

Accordingly, the durability of the pixel electrodes 110 is improved, preventing the picture quality of the organic light emitting display apparatus 100 from decreasing.

FIGS. 2A through 2F are schematic cross-sectional views for sequentially illustrating a method of manufacturing an organic light emitting display apparatus according to an embodiment of the present invention. In other words, FIGS. 2A through 2F are cross-sectional views for illustrating the method of manufacturing the organic light emitting display apparatus 100 of FIG. 1.

Figure 2A:
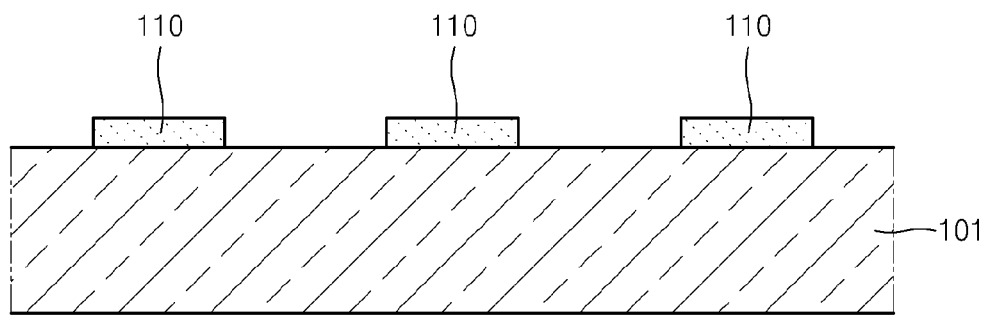
FIGS. 2A through 2F are schematic cross-sectional views for sequentially illustrating a method of manufacturing an organic light emitting display apparatus according to an embodiment of the present invention.

Referring to FIG. 2A, the pixel electrodes 110 are formed on the substrate 101. The pixel electrodes 110 include ITO and have stack structures of ITO, Ag, and ITO. Here, the silver is a reflective layer which reflects visible rays emitted from the organic light emitting layers, which are to be formed in a subsequent process, to the pixel electrodes 110, in order to generate the microcavity effect.

The pixel electrodes 110 include ITO adjacent to the substrate 101 in order to improve an adhesive strength between the pixel electrodes 110 and the substrate 110 or an insulating layer.

Figure 2B:
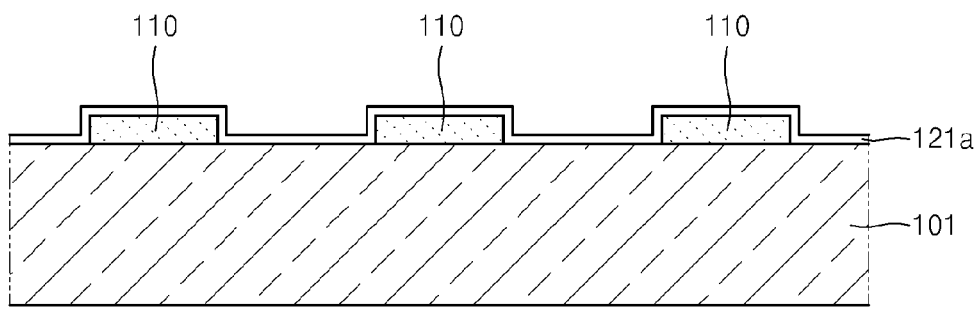

Referring to FIG. 2B, a first transmissive conductive material 121a is wholly formed on the pixel electrodes 110 to later form a first transmissive conductive layer and a second protector. The first transmissive conductive material 121a includes ITO.

Figure 2C:
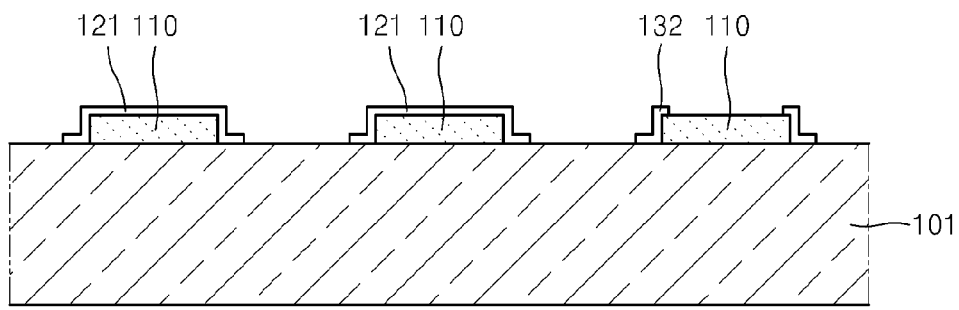

Referring to FIG. 2C, a patterning process such as photolithography is performed on the first transmissive conductive material 121a to form the first transmissive conductive layer 121 and the second protector 132.

In more detail, the first transmissive conductive layer 121 is formed on the pixel electrode 110 illustrated on the left side of FIG. 2C and the pixel electrode 110 illustrated in the middle of FIG. 2C. The first transmissive conductive layers 121 extend to cover outer edges and sides of the pixel electrodes 110 illustrated on the left side and in the middle of FIG. 2C. The second protector 132 is formed on the pixel electrode 110 illustrated on the right side of FIG. 2C. The second protector 132 exposes a predetermined area of the pixel electrode 110 illustrated on the right side of FIG. 2C and is formed to correspond to an edge of the pixel electrode 110 illustrated on the right side of FIG. 2C. In other words, the second protector 132 covers an outer edge and side of the pixel electrode 110 illustrated on the right side of FIG. 2C.

Figure 2D:
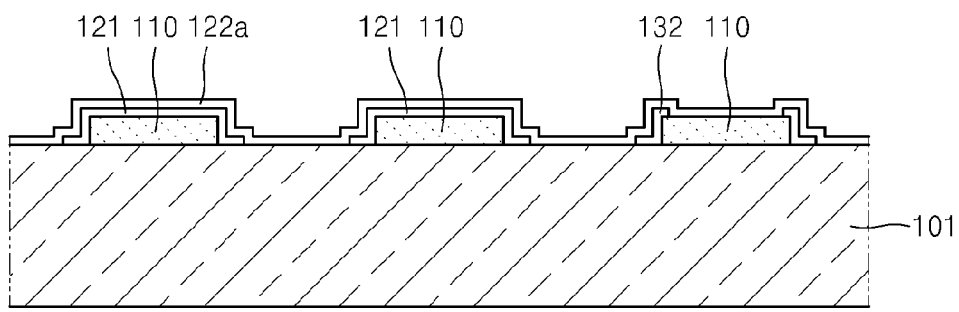

Referring to FIG. 2D, a second transmissive conductive material 122a is wholly formed to form the second transmissive conductive layer 122, and the first and third protectors 131 and 133. The second transmissive conductive material 122a includes ITO.

Figure 2E:
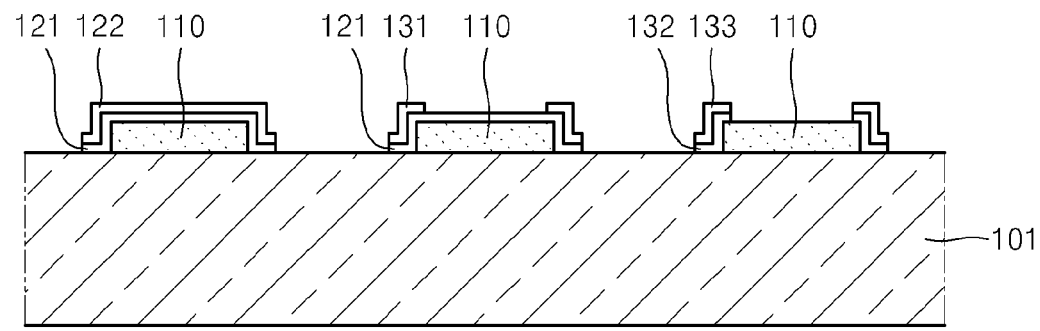

Referring to FIG. 2E, a patterning process such as photolithography is performed on the second transmissive conductive material 122a to form the second transmissive conductive layer 122, and the first and third protectors 131 and 133.

The second transmissive conductive layer 122 is formed on the first transmissive conductive layer 121 formed on the pixel electrode 110 illustrated on the left side of FIG. 2E. The second transmissive conductive layer 122 extends to cover all of an upper surface of the first transmissive conductive layer 121, and an area of the first transmissive conductive layer 121 corresponding to the outer edge of the pixel electrode 110 illustrated on the left side of FIG. 2E.

The first protector 131 is formed on an area of the first transmissive conductive layer 121 corresponding to the pixel electrode 110 illustrated in the middle of FIG. 2E. The first protector 131 exposes a predetermined area of the first transmissive conductive layer 121, and covers an area of the first transmissive conductive layer 121 corresponding to the outer edge of the pixel electrode 110 illustrated in the middle of FIG. 2E.

The third protector 133 is formed on the second protector 132 formed on the pixel electrode 110 illustrated on the right side of FIG. 2E. The third protector 133 exposes a predetermined area of the pixel electrode 110 illustrated on the right side of FIG. 2E. In other words, the third protector 133 covers an area of the second protector 132 corresponding to the outer edge of the pixel electrode 110 illustrated on the right side of FIG. 2E.

As shown in FIG. 2D, the second transmissive conductive layer 122a is formed, and then the patterning process, which may be photolithography, is performed to form the resultant structure of FIG. 2E. Here, a wet etching process is generally used. Without the first transmissive conductive layer 121 and the second protector 132, a wet etching solution used in the wet etching process may damage the pixel electrodes 110.

The first transmissive conductive layer 121 and the second protector 132 formed on the pixel electrodes 110 prevent the sides and outer edges of the pixel electrodes 110 from being damaged by the wet etching solution. In other words, the first transmissive conductive layer 121 formed on the pixel electrodes 110 illustrated on the left side and in the middle of FIG.

2E and the second protector 132 formed on the pixel electrode 110 illustrated on the right side of FIG. 2E protect the pixel electrodes 110 during the wet etching process for patterning the second transmissive conductive material 122a. Therefore, the durability of the pixel electrodes 110 is improved.

Figure 2F:
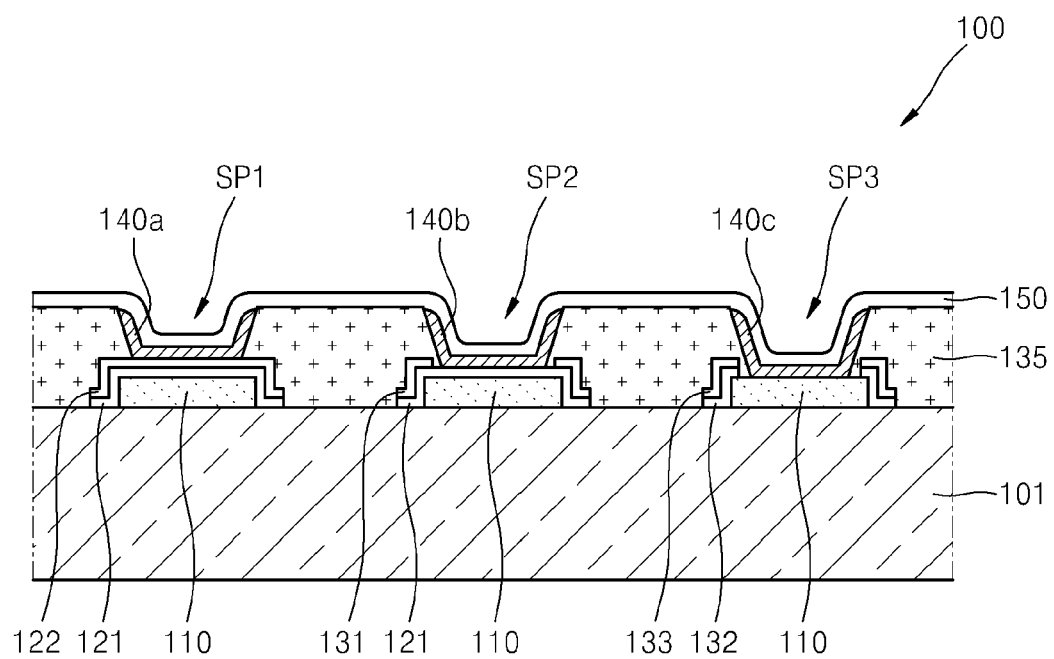

Referring to FIG. 2F, the PDL 135, the first, second, and third organic light emitting layers 140a, 140b, and 140c, and the counter electrode 150 are formed to completely manufacture the organic light emitting display apparatus 100.

The PDL 135 is formed on the first and second transmissive conductive layers 121 and 122 and the first, second, and third protectors 131, 132, and 133.

Openings are formed in the PDL 135 to expose the second transmissive conductive layer 122 formed on the pixel electrode 110 illustrated on the left side of FIG. 2F, the first transmissive conductive layer 121 formed on the pixel electrode 110 illustrated in the middle of FIG. 2F, and the pixel electrode 110 illustrated on the right side of FIG. 2F. The first, second, and third organic light emitting layers 140a, 140b, and 140c are formed on the exposed areas of the second transmissive conductive layer 122 formed on the pixel electrode 110 illustrated on the left side of FIG. 2F, the first transmissive conductive layer 121 formed on the pixel electrode 110 in the middle of FIG. 2F, and the pixel electrode 110 on illustrated the right side of FIG. 2F. Finally, a counter electrode 150 is formed on the organic layers 140a, 140b and 140c and the PDL 135.

In more detail, the first organic light emitting layer 140a is formed on the second transmissive conductive layer 122 formed on the pixel electrode 110 illustrated on the left side of FIG. 2F in order to emit R visible rays. The second organic light emitting layer 140b is formed on the first transmissive conductive layer 121 formed on the pixel electrode 110 illustrated in the center of FIG. 2F in order to emit G visible rays. The third organic light emitting layer 140c is formed on the pixel electrode 110 illustrated on the right side of FIG. 2F in order to emit B visible rays. The counter electrode 150 is commonly formed on/for all the sub-pixels in order to manufacture the organic light emitting display apparatus 100 including the first, second, and third sub-pixels SP1, SP2, and SP3.

Although not shown in FIGS. 2A through 2F, before the organic light emitting layers are formed on/for all the sub-pixels, a HIL or HTL may be formed.

A metal having a low work function, e.g., Ag, Mg, Al, Pt, Pd, Au, Ni, Nd, Ir, Cr, Li, Ca, or the compound of Ag, Mg, Al, Pt, Pd, Au, Ni, Nd, Ir, Cr, Li, or Ca, is deposited and a transparent conductive material such as ITO, IZO, ZnO, $In_2O_3$, or the like is deposited on the metal in order to form the counter electrode 150.

Although not shown in FIGS. 2A through 2F, an ETL or an EIL may be formed between the organic light emitting layers and the counter electrode 150.

A sealing member (not shown) is formed to face the surface of the substrate 101. The sealing member protects the organic light emitting layers from external moisture or oxygen and is formed of a transparent material. For this purpose, the sealing member is formed of glass, plastic, or a stack structure of a plurality of organic and inorganic materials.

The organic light emitting display apparatus 100 manufactured by the method according to an embodiment of the present invention forms different first and second transmissive conductive layers 121 and 122 on the pixel electrodes 110 of the first and second sub-pixels SP1 and SP2 in order to create the microcavity effect.

The first and second transmissive conductive layers 121 and 122 are formed on the pixel electrodes 110 of the first and second sub-pixels SP1 and SP2 to cover the outer edges of the pixel electrodes 110 of the first and second sub-pixels SP1 and SP2. In particular, the first transmissive conductive layer 121 protects the sides of the pixel electrodes 110 of the first and second sub-pixels SP1 and SP2. The second protector 132 covers the outer edge of the pixel electrode 110 of the second sub-pixel SP2. The first and third protectors 131 and 133 cover the outer edges of the pixel electrodes 110 of the second and third sub-pixels SP2 and SP3. Therefore, the pixel electrodes 110 are prevented from being damaged, in particular, the sides and upper surfaces the pixel electrodes 110 are effectively protected.

Accordingly, the pixel electrodes 110 and the first and second transmissive conductive layers 121 and 122 are easily formed according to their designs in order to improve the picture quality of the organic light emitting display apparatus 100 without reducing the microcavity effect.

FIGS. 3A through 3D are schematic cross-sectional views for sequentially illustrating a method of manufacturing the organic light emitting display apparatus 100, according to another embodiment of the present invention.

Figure 3A:
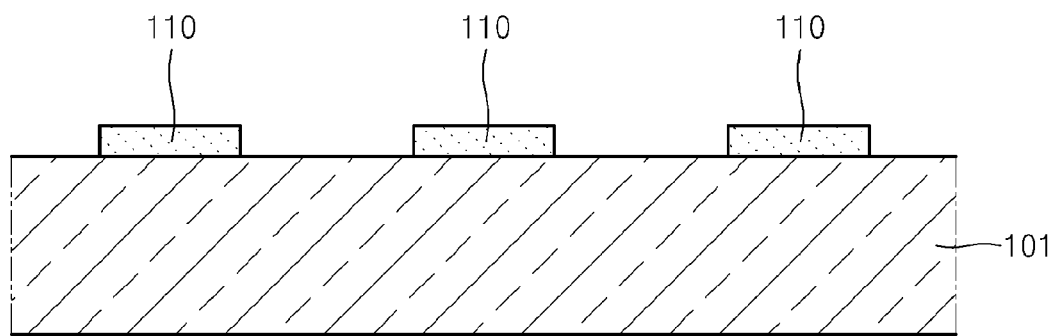
FIGS. 3A through 3D are schematic cross-sectional views for sequentially illustrating a method of manufacturing an organic light emitting display apparatus according to another embodiment of the present invention.

Referring to FIG. 3A, the pixel electrodes 110 are formed on the substrate 101. The pixel electrodes 110 include ITO and are stack structures of ITO, Ag, and ITO.

Figure 3B:
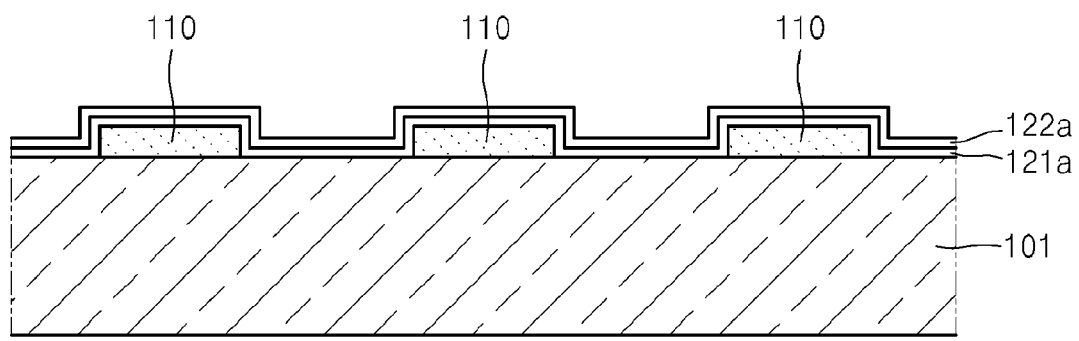

Referring to FIG. 3B, the first and second transmissive conductive materials 121a and 122a are formed on the pixel electrodes 110.

The first transmissive conductive material 121a is formed on the substrate 101 and pixel electrodes 110 to form a first transmissive conductive layer and a second protector, and the second transmissive conductive material 122a is formed on the first transmissive conductive material 121 to form a second transmissive conductive layer, and first and third protectors.

The first and second transmissive conductive materials 121a and 122a are formed on/over/for all of the pixel electrodes 110 without performing an additional patterning process. The first and second transmissive conductive materials 121a and 122a include ITO.

Figure 3C:
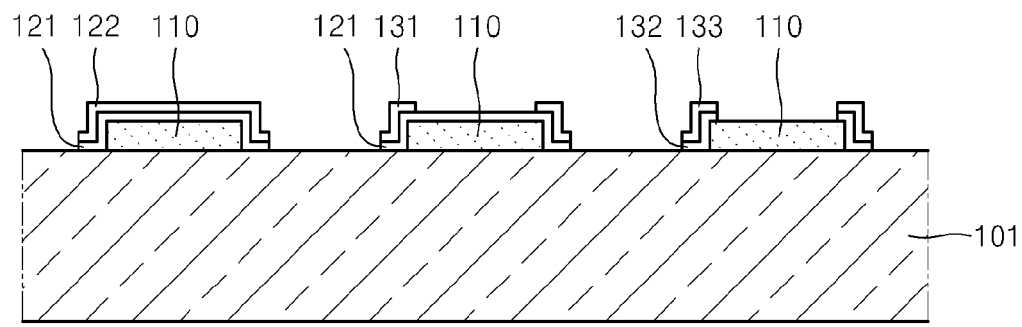

Referring to FIG. 3C, a patterning process such as photolithography is performed on the first and second transmissive conductive materials 121a and 122a to form the first and second transmissive conductive layers 121 and 122 and the first, second, and third protectors 131, 132, and 133.

In more detail, the first and second transmissive conductive layers 121 and 122 are formed on the pixel electrode 110 on the left side of FIG. 3C. The first transmissive conductive layer 121 extends to cover the outer edge and side of the pixel electrode 110 on the left side of FIG. 3C. The second transmissive conductive layer 122 is formed on the first transmissive conductive layer 121. The second transmissive conductive layer 122 extends to cover all of the upper surface of the first transmissive conductive layer 121, and the area of the first transmissive conductive layer 121 corresponding to the outer edge of the pixel electrode 110 on the left side of FIG. 3C.

The first transmissive conductive layer 121 and the first protector 131 are formed on the pixel electrode 110 in the middle of FIG. 3C. The first transmissive conductive layer 121 extends to cover the outer edge and side of the pixel electrode 110 in the middle of FIG. 3C. The first protector 131 is formed on the first transmissive conductive layer 121. The first protector 131 exposes the predetermined area of the first transmissive conductive layer 121 and covers an area of the first transmissive conductive layer 121 corresponding to the outer edge of the pixel electrode 110 in the middle of FIG. 3C.

The second and third protectors 132 and 133 are formed on the pixel electrode 110 illustrated on the right side of FIG. 3C. The second protector 132 exposes the predetermined area of the pixel electrode 110 illustrated on the right side of FIG. 3C and is formed to correspond to the edge of the pixel electrode 110 illustrated on the right side of FIG. 3C. In other words, the second protector 132 covers the outer edge and side of the pixel electrode 110 illustrated on the right side of FIG. 3C. The third protector 133 is formed on the second protector 132. The third protector 133 exposes the predetermined area of the pixel electrode 110 illustrated on the right side of FIG. 3C. In other words, the third protector 133 covers the area of the second protector 132 corresponding to the outer edge of the pixel electrode 110 illustrated on the right side of FIG. 3C.

As described with reference to FIG. 3B, the first and second transmissive conductive materials 121a and 122a are formed on the pixel electrodes 110, and then photolithography including one-time exposure using a halftone mask is performed in order to form the resultant structure of FIG. 3C. In more detail, a relatively small amount of exposure energy is applied to an area in which the first and second transmissive conductive materials 121a and 122a are to remain, using the halftone mask. A large amount of exposure energy is applied to an area in which only the first transmissive conductive material 121a is to remain. A larger amount of exposure energy is applied to an area in which the first and second transmissive conductive materials 121a and 122a are to be removed.

However, the present invention is not limited thereto, and the order of applying the amounts of exposure energy may vary according to the types of photoresist used.

The pixel electrodes 110 are prevented from being damaged in the wet etching process in order to improve the durability of the pixel electrodes 110.

Figure 3D:
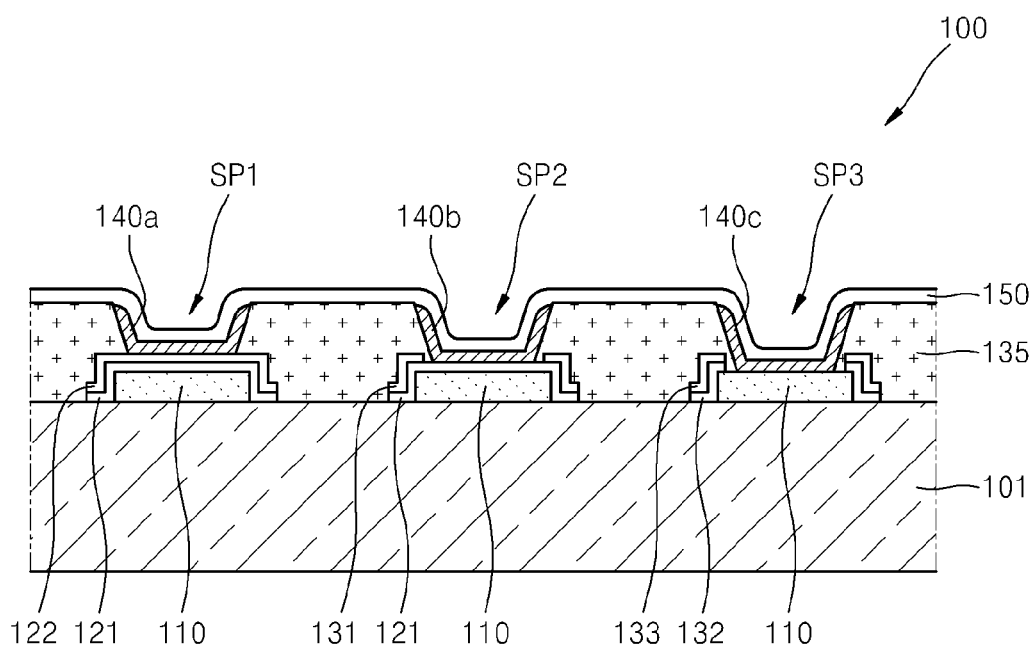

Referring to FIG. 3D, the PDL 135, the first, second, and third light emitting layers 140a, 140b, and 140c, and the counter electrode 150 are formed to manufacture the organic light emitting display apparatus 100.

The PDL 135 is formed on the first and second transmissive conductive layers 121 and 122 and the first, second, and third protectors 131, 132, and 133.

Openings are formed in the PDL 135 to expose the second transmissive conductive layer 122 formed on the pixel electrode 110 on the left side of 3D, the first transmissive conductive layer 121 formed on the pixel electrode 110 in the middle of FIG. 3D, and the pixel electrode 110 on the right side of 3D. The organic light emitting layers and the counter electrode 150 are formed on the first and second transmissive conductive layers 121 and 122 and the pixel electrodes 110.

The first organic light emitting layer 140a is formed on the second transmissive conductive layer 122 formed on the pixel electrode 110 illustrated on the left side of FIG. 3D in order to emit R visible rays. The second organic light emitting layer 140b is formed on the first transmissive conductive layer 121 formed on the pixel electrode 110 illustrated in the middle of FIG. 3D in order to emit G visible rays. The third organic light emitting layer 140c is formed on the pixel electrode 110 illustrated on the right side of FIG. 3D in order to emit B visible rays. The counter electrode 150 is formed throughout all the sub-pixels in order to manufacture the organic light emitting display apparatus 100 including the first, second, and third sub-pixels SP1, SP2, and SP3.

Although not shown in FIGS. 3A through 3D, before the organic light emitting layers are formed, an HIL or HTL may be formed throughout the all sub-pixels.

A metal having a low work function, e.g., Ag, Mg, Al, Pt, Pd, Au, Ni, Nd, Ir, Cr, Li, Ca, or a compound of Ag, Mg, Al, Pt, Pd, Au, Ni, Nd, Ir, Cr, Li, or Ca, is deposited and the transparent conductive material such as ITO, IZO, ZnO, $In_2O_3$, or the like is deposited on the metal in order to form the counter electrode 150.

Although not shown in FIGS. 3A through 3D, an ETL or an EIL may be formed between the organic light emitting layers and the counter electrode 150 throughout all the sub-pixels.

The sealing member (not shown) is formed to face the surface of the substrate 101. The sealing member protects the organic light emitting layers from external moisture or oxygen and is formed of a transparent material. For this purpose, the sealing member is formed of glass, plastic, or a stack structure of a plurality of organic and inorganic materials.

The first and second transmissive conductive layers 121 and 122 are formed differently on the pixel electrodes 110 in the sub-pixels in order to create the microcavity effect.

The first and second transmissive conductive layers 121 and 122 are formed on the pixel electrodes 110 to cover the outer edges of the pixel electrodes 110. In particular, the first transmissive conductive layer 121 covers the sides of the pixel electrodes 110 of the first and second sub-pixels SP1 and SP2 to prevent the pixel electrodes 110 from being damaged.

The second protector 132 is formed to cover the outer edge of the pixel electrode 110 of the third sub-pixel SP3. The first and third protectors 131 and 133 are formed to cover the outer edges of the pixel electrodes 110 of the second and third sub-pixels SP2 and SP3. Therefore, the pixel electrodes 110 are prevented from being damaged. In particular, the sides and the upper surfaces of the pixel electrodes 110 are protected.

Accordingly, the pixel electrodes 110 and the first and second transmissive conductive layers 121 and 122 are easily formed in order to improve the picture quality of the organic light emitting display apparatus 100 without reducing the microcavity effect.

Also, a process of using a halftone mask is an efficient process that may be applied to manufacture the organic light emitting display apparatus 100. Also, the number of exposure processes is reduced to only one time thereby reducing the number of wet etching processes in order to prevent the pixel electrodes 110 from being damaged.

As described above, an organic light emitting display apparatus and a method of manufacturing the organic light emitting display apparatus according to an embodiment of the present invention have improved picture quality.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting display apparatus comprising:
   first, second, and third sub-pixels which are formed on a substrate,
   wherein the first sub-pixel comprises a first pixel electrode, a first transmissive conductive layer formed on the first pixel electrode, a second transmissive conductive layer formed on the first transmissive conductive layer, a first organic light emitting layer formed on the second transmissive conductive layer, and a counter electrode formed on the first organic light emitting layer;
   the second sub-pixel comprises a second pixel electrode, the first transmissive conductive layer formed on the second pixel electrode, a first protector covering an edge of the first transmissive conductive layer, a second organic light emitting layer electrically connected to the first transmissive conductive layer, and the counter electrode formed on the second organic light emitting layer; and the third sub-pixel comprises a third pixel electrode, a second protector covering an outer edge of the third pixel electrode, a third protector formed on the second protector, a third organic light emitting layer electrically connected to the third pixel electrode, and the counter electrode formed on the third organic light emitting layer.

2. The organic light emitting display apparatus of claim 1, wherein the first, second and third pixel electrodes comprise Indium-Tin Oxide (ITO).

3. The organic light emitting display apparatus of claim 1, wherein the first, second and third pixel electrodes are formed in stack structures of ITO, silver (Ag), and ITO.

4. The organic light emitting display apparatus of claim 1, wherein the first organic light emitting layer emits red (R) visible rays, the second organic light emitting layer emits green (G) visible rays, and the third organic light emitting layer emits blue (B) visible rays.

5. The organic light emitting display apparatus of claim 1, wherein the first and second transmissive conductive layers comprise ITO.

6. The organic light emitting display apparatus of claim 1, wherein the first transmissive conductive layer extends to cover outer edges and sides of the first and second pixel electrodes of the first and second sub-pixels.

7. The organic light emitting display apparatus of claim 1, wherein the second transmissive conductive layer extends to cover an area of the first transmissive conductive layer corresponding to an outer edge of the first pixel electrode of the first sub-pixel.

8. The organic light emitting display apparatus of claim 1, wherein the first protector is formed of a same material as the second transmissive conductive layer.

9. The organic light emitting display apparatus of claim 1, wherein the second protector is formed of a same material as the first transmissive conductive layer.

10. The organic light emitting display apparatus of claim 1, wherein the third protector is formed of a same material as the second transmissive conductive layer.

11. The organic light emitting display apparatus of claim 1, wherein the first protector covers an area of the first transmissive conductive layer corresponding to an outer edge of the second pixel electrode of the second sub-pixel.

12. The organic light emitting display apparatus of claim 1, wherein the third protector covers an area of the second protector corresponding to an outer edge of the third pixel electrode of the third sub-pixel.

13. A method of manufacturing an organic light emitting display apparatus including first, second, and third sub-pixels formed on a substrate, the method comprising:

forming first, second and third pixel electrodes on the substrate;

forming a first organic light emitting layer in the first sub-pixel, a second organic light emitting layer in the second sub-pixel, and a third organic light emitting layer in the third sub-pixel, wherein the first, second, and third organic light emitting layers are electrically connected to the pixel electrodes; and forming a counter electrode on the first, second, and third organic light emitting layers, wherein the first sub-pixel comprises forming a first transmissive conductive layer between the first pixel electrode and the first organic light emitting layer and forming a second transmissive conductive layer between the first transmissive conductive layer and the first organic light emitting layer; the second sub-pixel comprises forming the first transmissive conductive layer between the second pixel electrode and the second organic light emitting layer and forming a first protector to cover an edge of the first transmissive conductive layer; and the third sub-pixel comprises forming a second protector between the third pixel electrode and the third organic light emitting layer to cover an outer edge of the third pixel electrode and forming a third protector on the second protector.

14. An organic light emitting display apparatus manufactured by the method of claim 13, wherein the first, second and third pixel electrodes comprise Indium-Tin Oxide (ITO).

15. An organic light emitting display apparatus manufactured by the method of claim 13, wherein the first, second and third pixel electrodes form stack structures of ITO, silver (Ag), and ITO.

16. An organic light emitting display apparatus manufactured by the method of claim 13, comprised of the first organic light emitting layer emitting red (R) visible rays, the second organic light emitting layer emitting green (G) visible rays, and the third organic light emitting layer emitting blue (B) visible rays.

17. An organic light emitting display apparatus manufactured by the method of claim 13, wherein the first and second transmissive conductive layers comprise ITO.

18. An organic light emitting display apparatus manufactured by the method of claim 13, wherein the first transmissive conductive layers extend to cover outer edges and sides of the first and second pixel electrodes of first and second sub-pixels.

19. The method of claim 13, wherein the second transmissive conductive layer extends to cover an area of the first transmissive conductive layer corresponding to an outer edge of the first pixel electrode of the first sub-pixel.

20. The method of claim 13, wherein the first protector is formed of a same material as the second transmissive conductive layer.

21. The method of claim 13, wherein the second protector is formed of a same material as the first transmissive conductive layer.

22. The method of claim 13, wherein the third protector is formed of a same material as the second transmissive conductive layer.

23. The method of claim 13, wherein the first protector covers an area of the first transmissive conductive layer corresponding to an outer edge of the second pixel electrode of the second pixel.

24. The method of claim 13, wherein the third protector covers an area of the second protector corresponding to an outer edge of the third pixel electrode of the third pixel.

25. The method of claim 13, wherein first and second transmissive conductive materials are sequentially formed on the first, second and third pixel electrodes formed in the first, second, and third sub-pixels, and photolithography comprising a one-time exposure process is performed using a halftone mask in order to form the first and second transmissive conductive layers and the first, second, and third protectors, wherein the first transmissive conductive material is formed to form the first transmissive conductive layer and the second protector, and the second transmissive conductive material is formed to form the second transmissive conductive layer and the first and third protectors.

26. A method of manufacturing an organic light emitting display apparatus including first, second and third sub-pixels, the method comprising:

forming first, second and third pixel electrodes on a substrate;

forming first and second transmissive conductive layers on the first, second and third pixel electrodes;

patterning the first and second transmissive conductive layers to form first and second transmissive conductive layers and first, second and third protectors;

forming an organic light emitting layer on the first, second and third pixel electrodes wherein the organic light emitting layer is electrically connected to the first, second and third pixel electrodes; and forming a counter electrode on the organic light emitting layer, wherein the first sub-pixel includes forming the first transmissive conductive layer between the first pixel electrode and the organic light emitting layer and forming the second transmissive conductive layer between the first transmissive conductive layer and the organic light emitting layer;

the second sub-pixel includes forming the first transmissive conductive layer between the second pixel electrode and the organic light emitting layer and forming the first protector to cover an outer edge of the first transmissive conductive layer; and the third sub-pixel includes forming the second protector between the third pixel electrode and the organic light emitting layer to cover an outer edge of the third pixel electrode and forming the third protector on the second protector.

27. An organic light emitting display apparatus manufactured by the method of claim 26, comprised of the organic light emitting layer formed on the first, second and third pixel electrodes, respectively, to emit red (R) visible rays, green (G) visible rays, and blue (B) visible rays.

28. An organic light emitting display apparatus manufactured by the method of claim 26, comprised of the first, second and third pixel electrodes comprising Indium-Tin Oxide (ITO).

29. An organic light emitting display apparatus manufactured by the method of claim 26, comprised of the first, second and third pixel electrodes forming stacked structures of ITO, silver (Ag), and ITO.

* * * * *